United States Patent [19]
Freeman

[11] Patent Number: 5,206,182
[45] Date of Patent: Apr. 27, 1993

[54] TRENCH ISOLATION PROCESS

[75] Inventor: Guy R. Freeman, Colorado Springs, Colo.

[73] Assignee: United Technologies Corporation, Hartford, Conn.

[21] Appl. No.: 363,000

[22] Filed: Jun. 8, 1989

[51] Int. Cl.[5] .................. H01L 21/302; H01L 21/328; H01L 21/334

[52] U.S. Cl. ........................................ 437/33; 437/26; 437/31; 437/57; 437/65; 437/67; 148/DIG. 151

[58] Field of Search .............. 437/63, 64, 65, 66, 437/67, 78, 31, 32, 33, 34, 38, 56, 57, 58, 59, 60, 919, 26; 357/34.43; 148/DIG. 151

[56] References Cited

U.S. PATENT DOCUMENTS

| 4,137,109 | 1/1979 | Aiken et al. | 437/66 |
|---|---|---|---|
| 4,264,382 | 4/1981 | Anantha et al. | 437/67 |
| 4,299,024 | 11/1981 | Diotrowski | 437/34 |
| 4,333,227 | 6/1982 | Horng et al. | 437/67 |
| 4,688,314 | 8/1987 | Weinberg et al. | 437/56 |
| 4,704,368 | 11/1987 | Goth et al. | 437/60 |
| 4,719,185 | 1/1988 | Goth | 437/31 |
| 4,808,548 | 2/1989 | Thomas et al. | 437/57 |
| 4,818,720 | 4/1989 | Iwasaki | 437/58 |
| 4,824,797 | 4/1989 | Goth | 437/63 |
| 4,871,685 | 10/1989 | Taka et al. | 437/33 |
| 5,066,602 | 11/1991 | Takemoto et al. | 437/31 |

OTHER PUBLICATIONS

Wolf, S., *Silicon Processing for the VLSI Era*, vol. 1, Lattice Press, 1986, pp. 295-308.

Primary Examiner—T. N. Quach

[57] ABSTRACT

A trench isolation process for bipolar and/or MOS circuits employs trench isolation with the trenches extending from an isolation region just below the surface down to and through a buried layer having the same dopant polarity as the isolation regions, so that inversion along the sidewalls of the trench is prevented.

21 Claims, 4 Drawing Sheets

FIG.1 FIELD THRESHOLD IMPLANT

FIG.2 FIELD DIFFUSION

FIG.3 N-, P-WELL DEFINITION

FIG.4 EMITTER IMPLANT

FIG.5 BASE IMPLANT

FIG.6 EMITTER, BASE DIFFUSION

FIG.7 CUT TRENCH

FIG.8 PNP, NPN WITH TRENCH

TRENCH ISOLATION PROCESS

DESCRIPTION

1. Technical Field

The field of the invention is that of integrated circuit processing, both bipolar and MOS processing.

2. Background Art

As integrated circuit densities have increased, a number of processes have been developed that use trenches for isolation between adjacent elements. Problems common to such processes have been the passivation of P-N junctions in the sidewall; the inversion of the sidewall producing parasitic transistors; the stress between geometries produced by differential piezoelectric effects of the material filling the trench or coating the trench; the high capacitance between the trench and the element beside the device; backfilling the trench; planarization of the surface of the trench in order to route polysilicon or metal over the trench; and dealing with an open trench during subsequent processing.

DISCLOSURE OF INVENTION

The invention relates to an improved trench process in which a buried layer is formed below circuit elements, including some that would not ordinarily have it, and in which a guarding region is implanted in the surface of the epitaxial layer having the same species and approximately the same concentration of dopant as the buried layer. The trench is cut after the high temperature processing steps are over, and is only temporarily filled. A planarizing layer is formed over the trench top, after which the temporary filler material is removed.

Another feature of the invention is the provision of a set of trenches having a uniform width for isolation of different circuit features.

Yet another feature of the invention is the use of a diffusion design rule requiring sufficient margin between a trench and any P-type diffusion such that no outdiffusion can reach and invert a trench sidewall.

Yet another feature of the invention is the ability to provide isolation of devices on multiple layers of epitaxial silicon or on a polysilicon layer deposited above an epitaxial layer. Yet another feature of the invention is a process for forming both bipolar and MOS transistors in which some process steps are used in both said bipolar and MOS transistors.

Other features and advantages will be apparent from the specification and claims and from the accompanying drawings which illustrate an embodiment of the invention.

BEST MODE FOR CARRYING OUT THE INVENTION

The invention relates to an improved integrated circuit process in which adjacent devices are isolated by a trench. The trench is cut from a doped region of the surface through a buried layer of the same polarity, thus eliminating the problems of sidewall inversion because the top and the bottom of the trench have the same polarity and are doped with a concentration sufficient to prevent inversion. Design rules provide for a uniform trench width and a minimum spacing between a P-type diffusion and the nearest trench, sufficient to prevent the outdiffusion from inverting the trench sidewall. The trench is only temporarily backfilled, and is empty in its final configuration, so that there is considerably less stress imposed by the trench or the passivation layers of the trench on the various layers of the circuit. A planarizing layer is formed over the temporary backfill with a number of apertures placed above the trench, after which the temporary backfill of the trench is removed through the apertures leaving the trench empty. The process is summarized in Table 1 in four major steps. Step I refers to essentially all devices. Steps II and III refer respectively to MOS (the term is applied to both metal gate- and silicon gate- FETs) and bipolar devices and Step IV again applies to essentially all devices. As can be seen in the considerably more detailed Table 2, the foregoing statements are generalizations and the process is well integrated in that whenever possible steps have been combined so that some bipolar steps are done in the MOS section and vice versa. The four major steps of the process have been divided into twelve secondary steps which have been further divided into 2, 3, or 4 sub-steps. Those skilled in the art will be well aware, of course, that there is necessarily a certain degree of arbitrariness in such a division. Some of the steps could have been further expanded in more detail and the choice was primarily for convenience in clearly displaying the steps in the figures.

Table 2 has been arranged so that on the left side of the table are the major devices, the NPN and PNP bipolar transistors and the N-channel and P-channel MOS transistors. Other devices that are integrated into the process are thin-film resistors, lateral and deep PNP transistors, implanted resistors, capacitors, bolts (which are ohmic contacts from the surface to the substrate) and a buried zener diode. Other devices that are consistent with this process and can be added to it without interference to any of the process steps are Schottky diodes, J-FETs, vertical PNPs, surface zeners, five to twenty volt $BV_{Dss}$ N/P channels for high voltage devices, base trenches for high frequency NPNs, D-MOS, polysilicon resistors, double level metal, SCRs, EPI FET, and Hall effect devices.

The steps of the process may briefly be summarized: in step 1 there is an initial oxidation across the wafer followed by A&E (alignment, expose and etch) of the buried layer, followed by a thin reoxidation for easier patterning, reduction of implant damage and reduction of channeling. Next, the buried layer is diffused into the substrate and the epitaxial layer is formed above the buried layer. The epitaxial layer is typically 15 microns thick for a process to produce bipolar devices having a breakdown voltage of 50 volts, and may be adjusted in thickness and resistivity as required to provide a different breakdown voltage. In the example illustrated, the epitaxial layer is doped N−, with a resistivity of 3-6K ohms/square and the buried layer is doped N+ with a resistivity of 10-15 ohms/square. An epitaxial layer is not necessary in order to use the invention, but is preferred for the ability to form both MOS and Bipolar devices. The buried layer not only is instrumental in preventing inversion of the trench walls, but also serves to prevent latch up in devices such as MOS transistors that do not ordinarily have buried layers. The buried layer is preferably continuous, but could be replaced, if desired, by a series of implants at the base of the trench that extend laterally by only a small amount.

Figure 1:
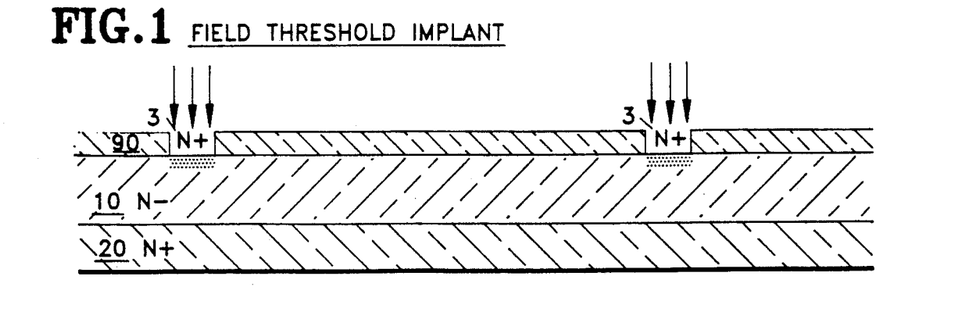
FIGS. 1-8, 9A, 9B and 9C illustrate various cross sections of selected steps in the trench formation process.

In Step 2, the field threshold adjust implant (FTA) for the field areas between devices is done. FIG. 1 illustrates an area of epitaxial layer 10 above a buried layer 20 that is bounded by two apertures 3 in photoresist layer 90, through which an Arsenic FTA implant is being performed. The region between the apertures may be filled with any active device, whether MOS or bipolar. These field areas that will be formed below apertures 3 replace the field regions in non-trench processing and will be the sites at which the trenches will be located. The trenches provide a channel stop and also a reduction in $R_{sat}$. The FTA implant is performed at a conventional energy of 70 kev and concentration of $6 \times 10^{12} - 1 \times 10^{16}$ such that after the high temperature processing steps, the resistivity of the final region 5 will be about the same as that of the buried layer 20.

Figure 2:
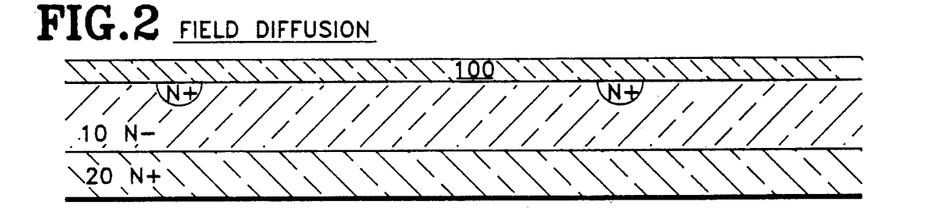

After the implant step, the epitaxial layer 10 is reoxidized and the layer is patterned for the sinker implant. The sinker is a high conductivity region between the surface and the buried layer that is used to reduce $R_{sat}$ in the NPN transistors. FIG. 2 shows a cross section of the same portion of the circuit after the diffusion of field threshold areas 5. Oxide layer 100 is formed in the epitaxial reoxidation step, which is also the diffusion step for areas 5. The top layer of oxide will be referred to by the same numeral 100 throughout, for convenience, whether it has been replaced by a different layer or not.

Figure 3:
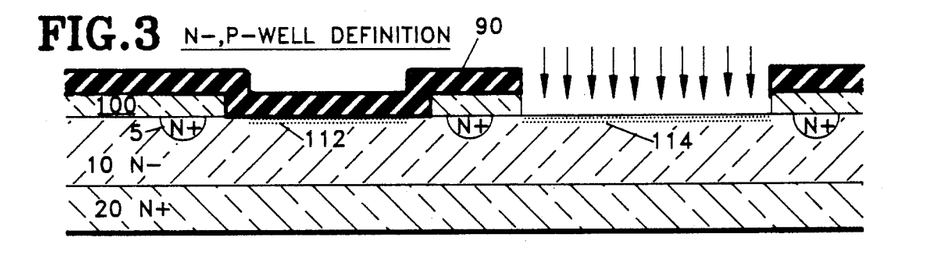

In Step 3, a specialized step is the implantation and diffusion of a highly doped area referred to conventionally as a bolt, which makes an electrical contact from the surface to the substrate but not the buried layer. The bolt and the vertical PNP transistors are the only devices which do not have a buried layer beneath them. Also in Step 3, the MOS wells are defined and implanted. FIG. 3 illustrates the step in which N-well 112, which has been implanted with a P− implant to raise the well doping from a nominal value of 4K ohms/square to a value of 7K ohms/square is covered by photoresist 90 while P-well 114 is currently being implanted with P+ as is conventional.

In Step 4, the bolts, the MOS wells and the sinkers are diffused, after which the active areas of MOS transistors are aligned and etched. If deep PNP and/or DMOS transistors are used, they may be defined, implanted and diffused at this time.

In Step 5, the N-channel and P-channel MOS thresholds are implanted, after the gate area has been stripped to provide for a gate oxide free of contamination from previous steps.

In Step 6, the final gate oxide for the MOS devices is formed and the first layer polysilicon is deposited, forming the gate electrodes for the MOS transistors and also the first level of interconnection. The poly may also be used for a self-aligned emitter/base process or emitter ballast resistors, if desired.

Figure 4:
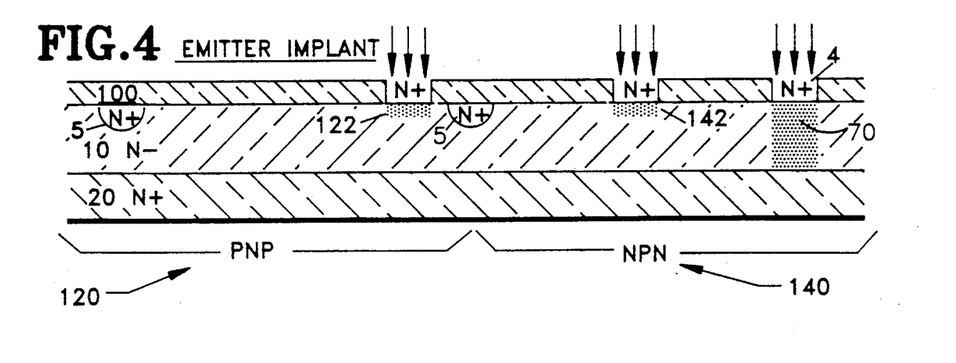
Figure 5:
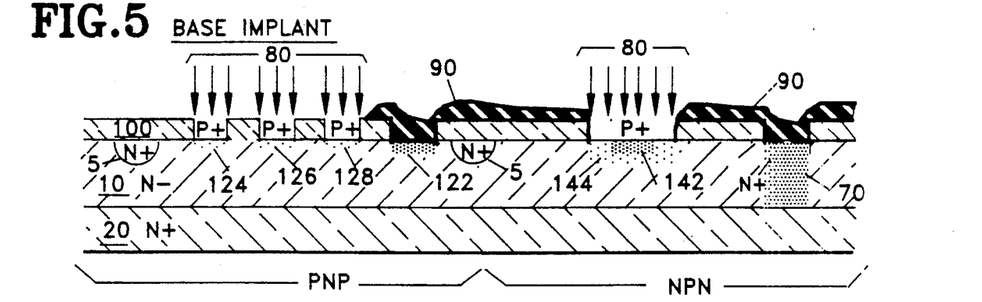

After the formation of the polysilicon layer and its definition, the MOS and bipolar transistors are simultaneously processed in that the N-channel sources and drains and the emitters are implanted after which the P-channel sources and drains and the bases are defined and implanted. The order may be reversed, of course. FIG. 4 shows an emitter implant step, for a PNP transistor on the left and an NPN on the right. The PNP is bounded by two FTA areas 5, but the NPN has a sinker 70 at the right edge. An N+ implant is performed for the emitters, including an implant on the top of the sinker to ensure a low resistivity path. FIG. 5 shows a base implant, with the implant area in the PNP and the area above the sinker covered by photoresist 90, but area 80 in the NPN is exposed to receive a P+ dose to form the base. It is not necessary that all combinations of PNP, NPN and MOS devices be made, of course. For example, a CMOS circuit might also have NPN transistors but not PNP. For the purposes of this disclosure, the dose used for P-channel sources and drains, PNP bases and/or NPN emitters will be referred to as a common dose or common implant and the corresponding dose for N-channel sources and drains, PNP emitters and/or NPN bases will also be referred to as a common dose, with appropriate distinguishing labels. Also, emitters, bases, sources and drains will be referred to generically as elements.

Figure 6:
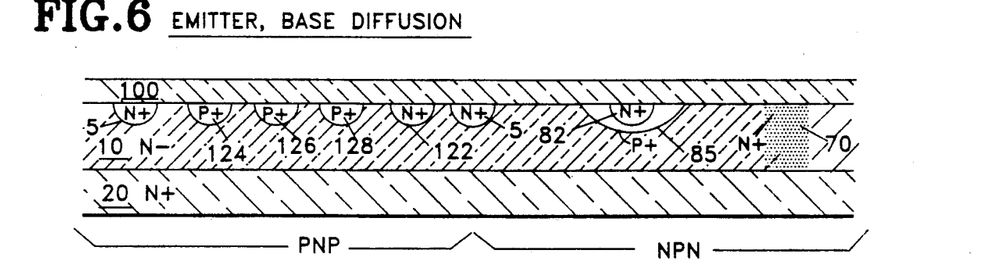

In Step 8, the sources, drains and substrate portions of bipolar devices are diffused. FIG. 6 shows the result of the diffusion of base and emitters, with base 85 extending past emitter 82 because Arsenic, the dopant for the emitter, diffuses more slowly than Boron, the dopant for the base of the NPN. The corresponding MOS source and drain diffusion is conventional and is omitted from the drawing for simplicity. If implanted resistors are used, they are defined at this time. An overall getter diffusion is formed across the wafer as a cleanup step for the MOS devices, yield enhancement, and a noise reduction step for the bipolar devices.

In Step 9, a deglaze step removes thermal oxide from the previous high temperature steps, after which a clean oxide is deposited at low temperature over all areas exposed in the previous step. This layer serves as the "field oxide".

Figure 7:
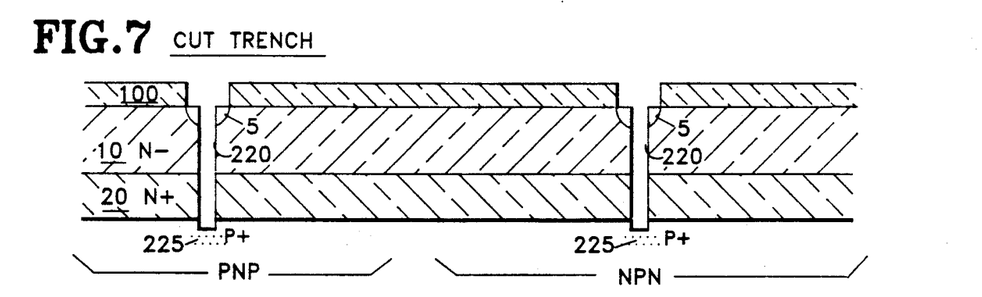
Figure 8:
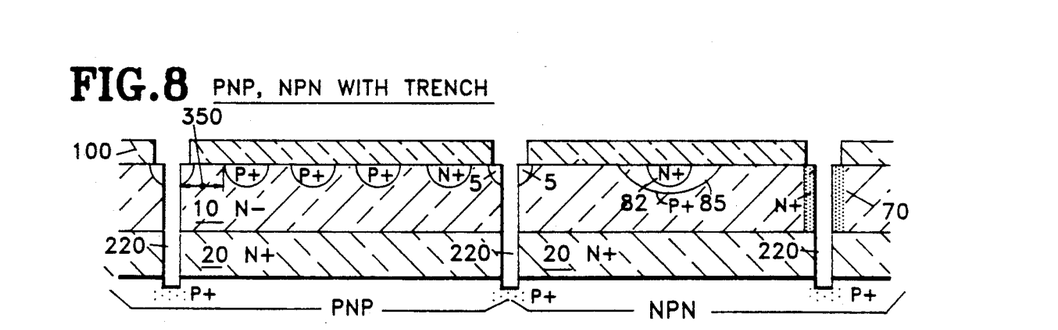

Then the trench is cut by a conventional RF assisted plasma etching process employing standard chemistry, well known to those skilled in the art, such as that recommended for the model 5000E machine, available from Allied Materials of Tempe, Ariz. The trench is cut with a nominal width of 0.5 to 2 microns to cut down to and through the buried layer with an aspect ratio of about 10:1. The width of the trench is not critical and will vary with different processes, as will the aspect ratio. Preferably, the width of the various trenches for a given process is kept constant to reduce problems found in prior art techniques in which trenches of different widths did not always strip or fill properly. FIG. 7 illustrates an area without any active devices, for simplicity in the drawing, with trenches 220 cutting through areas 5, to give a trench that starts in an N+ area, and cuts through a second N+ area, with an additional P+ channel stop 225 that is a process option implanted at the bottom of trenches 220. With this option, the danger of a parasitic NPN transistor being formed between two adjacent NPN's is reduced and the distance between adjacent NPN's will be a minimum. FIG. 8 illustrates the region shown in FIG. 6, with a corresponding additional trench, passing between region 5 and buried layer 20 or through sinker 70, as the case may be. The distance indicated by the numeral 350 in the PNP transistor is the tolerance required by the design rules between a P implant and the nearest trench wall. In the preferred embodiment, which is a 3 micron process, the value of this tolerance is 4 microns. Those skilled in the art will readily be able to adjust this tolerance to suit their own dopant concentrations and diffusion times and temperatures.

After the first step of oxidation, the capacitor is aligned and etched, removing both the thick layer of thermal field oxide and the deposited layer down to the silicon substrate in the capacitor areas. In step 10, the sidewall of the trench is oxidized in a step integrated with the first step of the capacitor oxidation. A thin layer 152 of oxide is either furnace grown or formed by Rapid Isothermal Processing using the same heat cycle as is used in forming gate capacitor oxides in a conventional reduced pressure furnace at a partial pressure of 0.3 atmospheres at a temperature of 1000 degrees centigrade for three hours, including the ramp up and down times. This particular sequence has the virtue of process simplicity, since the use of the same sequence reduces the possibility of error, but is not critical to final device performance. After the capacitor oxide has reached the desired thickness of 250 Angstroms, a layer of nitride 154, of approximately 1000 Angstroms thickness, is deposited over the entire wafer, including the sidewalls and bottom of the trench. The nitride serves to passivate the sidewalls of the trench and also to provide the desired capacitor breakdown voltage of 100 volts, as as the passivation of the die surface. The thickness of oxide 152 provides the desired capacitance of 0.32 pf/square mil, which is twice the capacitance per unit area provided by the standard processing of MOS capacitors. It also provides three times the the breakdown voltage of standard MOS capacitors, as well as defect immunity due to the etch selectivity of oxide versus nitride.

There is a further advantage to this process for capacitor formation in that, when a capacitor does break down, the mechanism is tunneling through the oxide. Since the tunneling does not damage the oxide, capacitors formed according to this process can survive voltage spikes that would destroy capacitors with the same voltage rating formed by conventional processes.

In addition to its use as the capacitor dielectric, the nitride layer extends over the bipolar devices and enhances their beta versus Ic performance. It also serves as a sodium barrier to passivate the entire wafer and is the preferred substrate for thin film resistors made by a rapid isothermal process.

In Step 11, with the trenches covered by photoresist, the nitride is cut out with oversized apertures to expose the active devices and the contact areas.

It is convenient to form any thin film resistors that may be used at this time. The thin film of silicon chrome, nickel chrome, tantalum silicide, or the like, is deposited on top of the nitride layer. A rapid isothermal process (exposure to 760 degrees C. for 28 seconds) may be used to adjust for the best temperature coefficient performance of the resistors. The nitride layer used in the capacitors is the substrate for the thin film resistors. After the resistor definition step, contacts are cut through the field oxide or the thick oxide over the active devices down to the contact areas in the epitaxial layer.

In Step 12, the planarization process of the trenches is performed, in which the trench is partially filled with photoresist. It does not matter if the photoresist does not penetrate to the bottom of the trench since it is the surface area that is of concern. With the photoresist extending across the wafer except for the trenches, the photoresist is eroded or etched down to the level of the surface, in a timed process that will in practice result in a slightly concave or convex photoresist surface. Also at this time, the contact areas are prepared for the first level metal that will make the actual electrical contact.

The first level of metal is deposited across the wafer and patterned to make the first level interconnects and also to cover the trench areas without contacting the devices or the interconnections. In the area above the trenches, the metal is formed with a "Swiss cheese" pattern in which approximately equal areas are covered with metal and are open to the photoresist below. In the last step concerned with the trench, the photoresist is stripped-off and etched out after the first level of metal is patterned. The photoresist stripper, such as POSISTRIP, made by the EKC corporation of Oakland Calif., is left on for a sufficient period and has a sufficiently low viscosity so that it penetrates down into the trench and removes the photoresist from the interior of the trench. A wet strip is followed by an oxygen plasma strip, both using standard chemistry.

Once the trenches are empty, they will, of course, be filled with air having a dielectric coefficient of one. This is a considerable improvement compared to other materials such as oxide which has a much higher dielectric coefficient of 4 to 14, depending on the type of oxide and residual doping elements retained in the oxide. With the prior art trench processes, the high dielectric coefficient within the trench contributed to a greatly increased capacitance between the adjacent active device and an active device within the tub defined by the trench.

After the trenches are empty and capped with oxide and nitride, the process can be continued with a second level of metal or any other further processing steps that are desired. The trenches can be restripped if they are planarized or filled in subsequent steps.

Some advantageous features of the process according to the invention are that the use of the field threshold adjust in a small area between devices, instead of a blanket implant across the wafer, avoids problems with a blanket implant which tend to compromise various diodes in the circuit. Preferably the field threshold adjustment implant is arsenic, which diffuses slowly to have a minimum transverse dimension. An advantage of the field threshold adjust method is that there is no area penalty caused by the use of the trench because it was necessary to have this much separation between adjacent transistors in any event, and the area required by the trench is much less than that of non-trench processing such as junction or LOCOS techniques.

Further, the saturated resistance of bipolar transistors is lower because the collector has a greater effective area, since the field threshold adjust implant in the epitaxial layer brings the resistance down from a nominal value of 4K ohms/square to less than 500 ohms/square and this low resistance is in parallel with the nominal path through the collector and sinker. Further, the use of a FTA in a defined area avoids diode breakdown problems between the collector and base regions of bipolar transistors that would come from a blanket implant, as well as problems of premature breakdown and increased leakage.

There is a further advantage from the use of a buried layer under the MOS devices in that the buried layer prevents latch-up when tied to the appropriate power supply terminal for either input or output devices.

The MOS process is abbreviated compared to the usual MOS process in that P-field and N-field masks and implant steps are omitted.

The elimination of backfill in the trench has a further advantage in that the use of an oxide backfill, for example, stresses the trench sidewalls which induces a piezoelectric affect on the devices in the tubs. This alters the Vbe of bipolar devices and alters the Vt of CMOS devices with the largest CMOS effect being on the Vt of the P-channel. With an empty trench, in that the tub and the epitaxial-buried layer-oxide sandwich is stress relieved so that the disadvantageous piezoelectric effect is much reduced. In design rules using this process, the horizontal distance between the trench and a "P" type diffusion is set such that the side lateral diffusion of any of the P dopants will not touch the sidewall so that the sidewall area will not become inverted. With the use of the same polarity dopant at the top and bottom of the trench, there is no voltage bias to cause a current to flow vertically along the trench sidewall even if an inversion is formed.

There is a further advantage in that high voltage devices are easier to make with this process. With this process, the reduction in displacement between the trench and the devices can be much less because the trench is in place of the traditional junction isolation technique that involves extensive lateral diffusion of the isolation dopant (Boron) that would be present in the thick epitaxial layer that is required for high voltage, resulting in improved spacing. With a process according to the invention, the area reserved for tolerance in lateral diffusion is less than 10% of a typical prior art area.

Figure 9A:
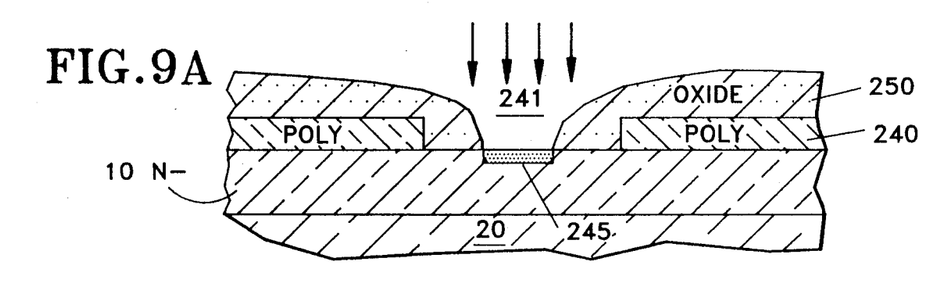
Figure 9B:
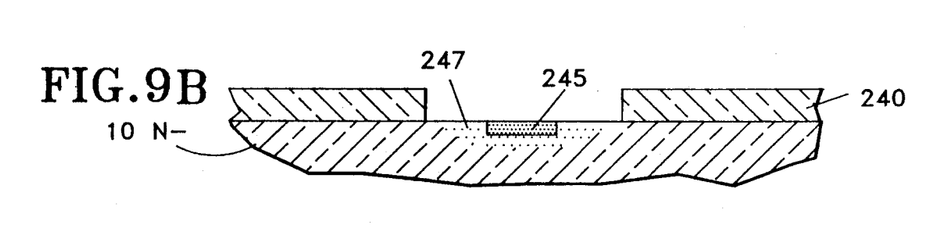
Figure 9C:
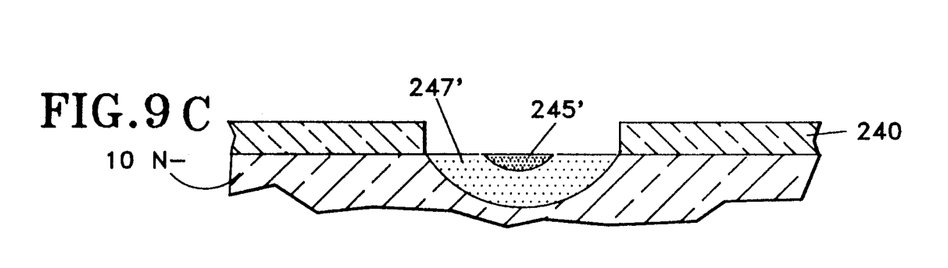

Referring now to FIGS. 9A-9C, there is shown an alternative method of forming the emitter and base areas of an NPN transistor. After polysilicon 240 is deposited, it is patterned with aperture 241 and oxide 250 is either deposited or grown over it and patterned, leaving a smaller aperture through which Arsenic is implanted in region 245. The oxide is stripped and a dose of Boron is implanted in region 247 as shown in FIG. 9B. After diffusion, the resultant emitter is in region 247' and the base is in region 245' as shown in FIG. 9C. This differentiation is maintained because the Boron was implanted outside the Arsenic and also because the Boron diffuses faster.

Most of the process steps can and in practice will be varied to suit the needs of different applications. Those skilled in the art will readily be able to adapt the process as desired.

The illustrations have shown a single epitaxial layer, but some circuits, such as those used for power transistors, may have two epitaxial layers. Trench isolation according to the invention may be used in such a case or in a case where it is desirable to isolate a section of polysilicon or polysilicon and an underlying epitaxial layer.

Figure 10:
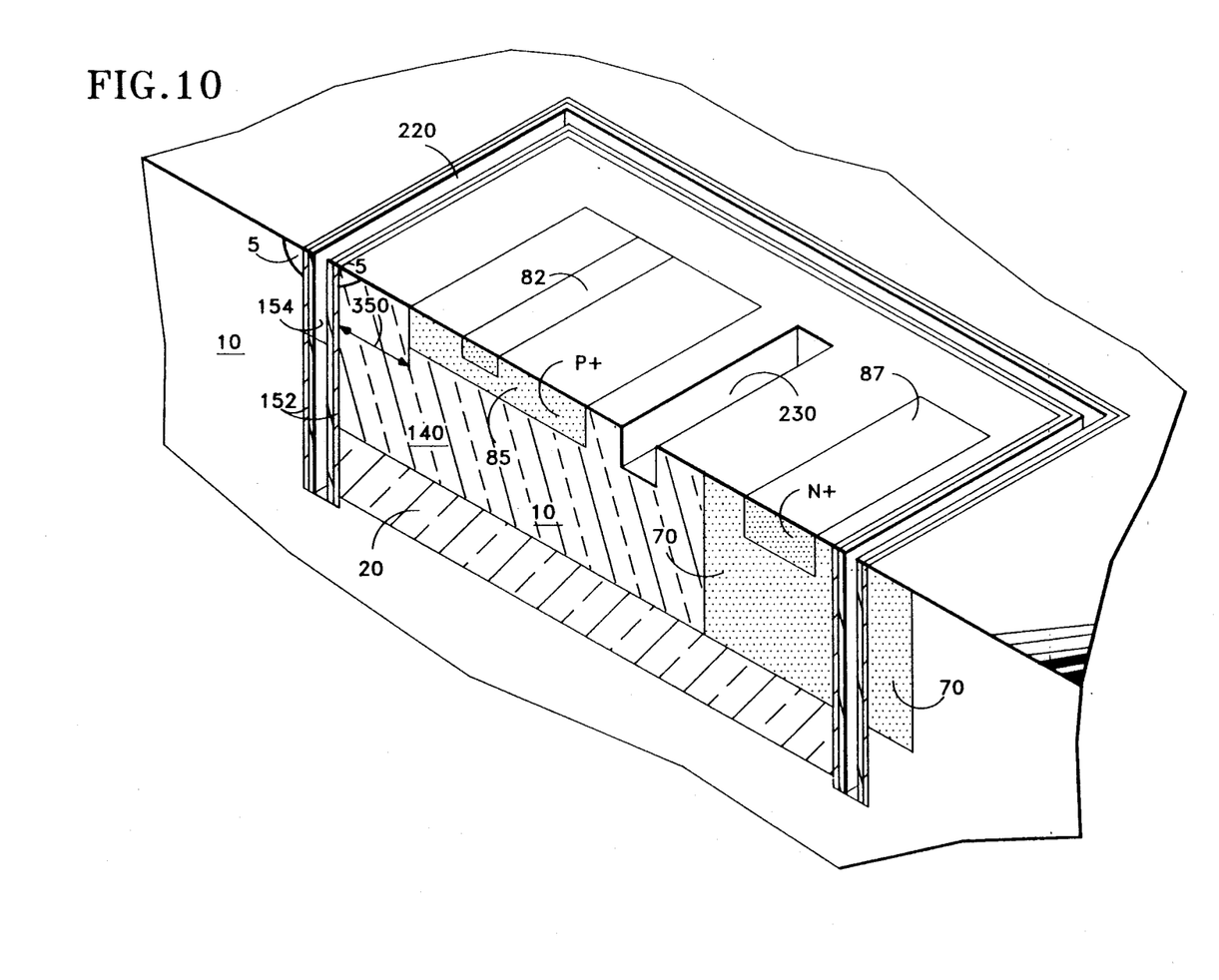
FIG. 10 illustrates in perspective form a transistor surrounded by a trench.
Figure 11:
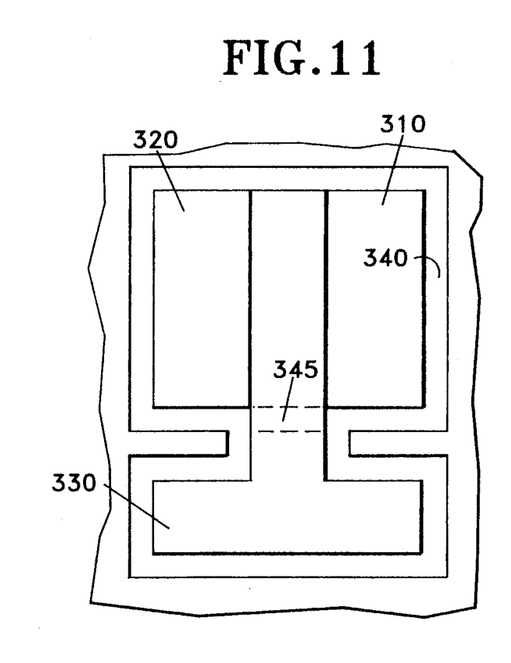
FIG. 11 illustrates a plan view of an MOS transistor formed according to the invention.

Another option using the invention is that a shallower trench may be cut around the base in a bipolar transistor, isolating the base and reducing the capacitance between the base and the collector. Such a transistor is shown in perspective in FIG. 10, in which NPN transistor 1 40 of FIG. 8 is surrounded by trench 220. Emitter 82 and base 85 are separated from collector 87 by trench 230, which is shown as being on only one side of the base, but could surround it. The oxide layer 152 and the nitride layer 154 are also shown in this view. Portions of layer 154 are shown passivating the P-N junctions between the emitter and the base. Sinker 70 extends into the adjacent area, which could be another NPN transistor in a mirror image layout. The arrow indicated with the numeral 350 represents the tolerance from the edge of the base implant to the wall of trench 220. Similarly, a trench may be cut around the source/drain region in an MOS transistor, to reduce capacitance between the transistor and the rest of the tub in which it is formed. A top view is shown in FIG. 11, in which source 310, drain 320 and gate 330 are surrounded by trench 340. Note that trench 340 extends under gate 330 in the region indicated by the numeral 345. This was accomplished by doping gate 330 and oxidizing it to provide etch resistance, then overetching when the trench is cut, so that gate 330 is undercut. Alternatively, a pedestal of silicon could have been left under the gate, with normal etching.

The trench is cut after nearly all of the high temperature steps are performed, with the only remaining high temperature step being the oxide growing process for the trench walls. Accordingly, there is no danger that the trench walls can become autodoped through excessive diffusion, as might be the case if the trench were formed earlier in the process.

A further option is that wafers with a <100> orientation instead of the more expensive <111> orientation wafers, because processing with an FTA and trench permits satisfactory operation of bipolar devices in the <100> structure that is preferred for MOS devices.

TABLE I

| STEP | DEVICE | PROCESS STEP |
|------|--------|--------------|
| I | All | Buried Layer |
| II | MOS | N and P- Wells/Active, gate oxide poly gate |
| III | Bipolar | Emitter, Base |
| IV | All | Trench Cut, Nitride, Contacts, Planarization Metal 1 |

TABLE 2

| | | | LATERAL PNP | NPN | DEEP PNP | VERT PNP | N-MOS | P-MOS | BURIED ZENER | THIN RESISTOR | IMPL RESISTOR | CAPACITOR | BOLT | |
|---|---|---|---|---|---|---|---|---|---|---|---|---|---|---|
| INOX | 1 | A | X | X | X | X | X | X | X | X | X | X | X | |
| BL IMPL | | B | X | X | X | — | X | X | X | X | X | X | — | |
| BL DIFF | | C | X | X | X | — | X | X | X | X | X | X | — | |
| EPI | | D | X | X | X | X | X | X | X | X | X | X | X | I |
| FTA | 2 | A | X | X | X | X | X | X | X | X | X | X | X | |
| EPI REOX | | B | X | X | X | X | X | X | X | X | X | X | X | |
| SINKER | | C | — | X | — | — | — | — | — | — | — | — | — | |
| BOLT | 3 | A | — | — | — | — | — | — | X | — | — | — | X | |
| NWELL | | B | — | — | — | — | X | — | — | — | — | — | — | |
| PWELL | | C | — | — | — | — | — | X | — | — | — | — | — | |
| BOLT DIFF | 4 | A | — | X | — | — | X | X | X | — | — | — | X | |
| ACTIVE | | B | — | — | — | — | X | X | — | — | — | — | — | |
| DEEP P+ | | C | — | — | X | — | — | X | — | — | — | — | — | |
| STRIP | 5 | A | — | — | — | — | X | X | — | — | — | — | — | |

TABLE 2-continued

| | | | LATERAL PNP | NPN | DEEP PNP | VERT PNP | N-MOS | P-MOS | BURIED ZENER | THIN RESISTOR | IMPL RESISTOR | CAPACITOR | BOLT | |
|---|---|---|---|---|---|---|---|---|---|---|---|---|---|---|
| GATE OX VTN | | B | — | — | — | — | X | X | — | — | — | — | — | II |
| VTP | | C | — | — | — | — | — | X | — | — | — | — | — | |
| STRIP GATE | 6 | A | — | — | — | — | X | X | — | — | — | — | — | |
| GATE OX | | B | — | — | — | — | X | X | — | — | — | — | — | |
| POLY DEP | | C | — | — | — | — | X | X | — | — | — | — | — | |
| POLY A&E | 7 | A | — | — | — | — | X | X | — | — | — | — | — | |
| EMITTER | | B | X | X | X | X | X | — | X | — | — | X | — | |
| BASE | | C | X | X | — | X | — | X | X | — | — | — | — | |
| BASE DIFF | 8 | A | X | X | X | X | X | X | X | — | — | X | — | III |
| IMP RES | | B | — | — | — | — | — | — | — | — | X | — | — | |
| GETTER | | C | X | X | X | X | X | X | X | X | X | X | X | |
| SOE | 9 | A | X | X | X | X | X | X | X | X | X | X | X | |
| TRENCH | | B | X | X | X | X | X | X | X | X | X | X | X | |
| OXIDE | 10 | A | X | X | X | X | X | X | X | X | X | X | X | |
| CAP A&E | | B | — | — | — | — | — | — | — | — | — | X | — | |
| NITRIDE DEP | | C | X | X | X | X | X | X | X | X | X | X | X | |
| OVERSIZE | 11 | A | X | X | X | X | X | X | X | X | X | X | X | IV |
| TFDEP | | B | — | — | — | — | — | — | — | X | — | — | — | |
| CONTACT | | C | X | X | X | X | X | X | X | — | X | X | X | |
| PLANARIZATION | 12 | A | X | X | X | X | X | X | X | X | X | X | X | |
| ERODE | | B | X | X | X | X | X | X | X | X | X | X | X | |
| METAL 1 | | C | X | X | X | X | X | X | X | X | X | X | X | |

What is claimed is:

1. A method of making an integrated circuit having active and passive devices formed in a epitaxial silicon layer disposed above a substrate region, comprising the steps of:
    forming a buried layer in selected regions of said silicon layer below said epitaxial layer, said buried layer being formed by doping with a predetermined buried layer dopant;
    forming surface isolation boundary regions in and below the surface of said epitaxial silicon layer about selected areas, by doping said epitaxial silicon layer with a predetermined surface isolation dopant of the same polarity as said buried layer dopant, for isolating said selected areas from one another;
    forming components of said active and passive devices in said epitaxial silicon layer;
    thereafter cutting a trench, having a sidewall, from said surface isolation boundary regions down through said epitaxial silicon layer to said buried layer;
    forming a sidewall liner on a sidewall of said trench by oxidizing said sidewall to a predetermined thickness of sidewall oxide and subsequently depositing a layer of sidewall nitride to a predetermined nitride thickness on said sidewall oxide
    filling at least the upper portions of said trench with a temporary backfill material;
    depositing a cover layer above at least a portion of said trench, said cover layer being patterned to expose a portion of said temporary backfill through backfill removal apertures;
    removing at least a portion of said temporary backfill, whereby said trench is at least partially empty; and
    connecting said components to form an integrated circuit having said trench substantially empty.

2. A method according to claim 1, in which both bipolar and MOS devices are formed in said epitaxial layer;
    said bipolar devices are selected from the set consisting of PNP and NPN transistors and the method of implanting PNP emitters and NPN bases employs a first common implant dose, whereby PNP emitters and NPN bases may be implanted simultaneously, and the method of implanting NPN emitters and PNP bases employs a second common implant dose, whereby NPN emitters and PNP bases may be implanted simultaneously; and
    said MOS devices are selected from the set consisting of P-channel and N-channel devices, with P-channel sources and drains being made with the same implant method as said PNP emitters and NPN bass and N-channel sources and drains being made with the same implant method as said NPN emitters and said PNP bases, whereby a circuit having at least one type or bipolar device and at least one type of MOS device may be formed by said method according to claim 1, in which sources and drains of said at least one type of MOS device may be implanted simultaneously with one of said first and second common implant dose.

3. A method according to claim 2, in which only one type of said P-channel and N-channel devices is formed, the sources and drains of which are implanted simultaneously with at least one corresponding element in said set of PNP and NPN transistors.

4. A method according to claim 2, in which both types of said P-channel and N-channel devices are formed, the sources and drains of which are implanted simultaneously with at least one corresponding element in said set of PNP and NPN transistors.

5. A method according to claim 2, in which both PNP and NPN transistors are formed, with emitters and bases being implanted simultaneously with at least one corresponding element in said set of P-channel an N-channel device.

6. A method according to claim 2, in which PNP, NPN, P-channel and N-channel transistors are all formed, the emitters of said PNP transistors and the bases of said NPN transistors being implanted simultaneously with the sources and drains of said N-channel transistors and the emitters of said NPN transistors and the bases of said PNP transistors being implanted simultaneously with the sources and drains of said P-channel transistors.

7. A method according to claim 2, in which said passive devices include at least one capacitor disposed on said epitaxial layer having a capacitor dielectric substantially parallel to said epitaxial layer that has the same composition as said sidewall liner and is formed in said steps of oxidizing said sidewall and depositing said layer of sidewall nitride, whereby the same steps are used for both said trench sidewall liner and said capacitor dielectric.

8. A method according to claim 7, in which said sidewall oxide is approximately 250Å thick and said sidewall nitride is approximately 1000Å thick.

9. A method according to claim 2, in which bipolar devices having a base region are formed with the further step of cutting a second type of trench to a predetermined second depth of said epitaxial layer between a base region and a collector region, whereby a collector base capacitance is reduced through the interposition of said partially empty trench between said base and said collector regions.

10. A method according to claim 2, in which all P-type implant regions within an area bordered by a trench are disposed at least a predetermined tolerance distance from said trench sidewall, said tolerance distance being such that said P-type implant regions do not diffuse to make contact with said trench sidewalls.

11. A method according to claim 2, in which said substrate is of <100> silicon.

12. A method according to claim 1, in which said passive devices include at least one capacitor disposed on said epitaxial layer and having a capacitor dielectric substantially parallel to said epitaxial layer that has the same composition as said sidewall liner and is formed in said steps of oxidizing said sidewall and depositing said layer of sidewall nitride, whereby the same steps are used for both said trench sidewall liner and said capacitor dielectric.

13. A method according to claim 12, in which said sidewall oxide is approximately 250Å thick and said sidewall nitride is approximately 1000Å thick.

14. A method according to claim 12, in which said sidewall oxide is approximately 250Å thick and said sidewall nitride is approximately 1000Å thick.

15. A method according to claim 1, in which bipolar devices having a base region are formed with the further step of cutting a second type of trench to a predetermined second depth of said epitaxial layer between a base region and a collector region, whereby a collector base capacitance is reduced through the interposition of said partially empty trench between said base and said collector regions.

16. A method according to claim 1, in which all P-type implant regions within an area bordered by a trench are disposed at least a predetermined tolerance distance from said trench sidewall, said tolerance distance being such that said P-type implant regions do not diffuse to make contact with said trench sidewalls.

17. A method of making an integrated circuit having active MOS devices and passive devices formed in a silicon wafer, comprising the steps of:
  forming a buried layer in selected regions of said silicon wafer, said buried layer being formed by doping with a predetermined buried layer dopant;
  forming surface isolation boundary regions in and below the surface of said silicon wafer about selected areas, by doping said silicon wafer with a predetermined surface isolation dopant of the same polarity as said buried layer dopant, for isolating said selected areas from one another;
  forming components of said active and passive devices in said silicon wafer;
  thereafter cutting a trench, having a sidewall, from said surface isolation boundary regions down through said silicon wafer to said buried layer;
  forming a sidewall liner on a sidewall of said trench by oxidizing said sidewall to a predetermined thickness of sidewall oxide and subsequently depositing a layer of sidewall nitride to a predetermined nitride thickness on said sidewall oxide;
  filling at least the upper portions of said trench with a temporary backfill material;
  depositing a cover layer above at least a portion of said trench, said cover layer being patterned to expose a portion of said temporary backfill through backfill removal apertures, and;
  removing at least a portion of said temporary backfill, whereby said trench is at least partially empty; and
  connecting said components to form an integrated circuit having said trench substantially empty.

18. A method according to claim 17, in which said passive devices include at least one capacitor having a capacitor dielectric that has the same composition as said sidewall liner and is formed in said steps of oxidizing said sidewall and depositing said layer of sidewall nitride, whereby the same steps are used for both said trench sidewall liner and said capacitor dielectric.

19. A method according to claim 17, in which a step of implanting sinkers, N-wells and P-wells is preceded by a step of forming a buried layer having a buried layer dopant concentration below the sites of said NPN, PNP, N-channel and P-channel devices;
  a further step is performed of forming field threshold adjustment regions in the upper portion of said silicon substrate, having a dopant concentration of about the same magnitude and of the same polarity as said buried layer dopant concentration; and
  a trench is cut about said PNP, NPN, N-channel and P-channel devices from said field threshold adjustment regions down to said buried layer, whereby said devices are isolated from one another by said trenches.

20. A method of making an integrated circuit in an epitaxial layer on a silicon substrate containing both N and P channel MOS devices and bipolar NPN and PNP devices, the method comprising the steps of:
  doping said silicon substrate with a dopant of the type N-;

forming one or more N-wells and one or more P-wells in said epitaxial layer;

implanting a continuous buried layer region to be disposed below said epitaxial layer;

implanting dopants in said epitaxial layer for one or more N-wells and for one or more P-wells for a MOS device, both said dopant for said N-wells and said dopant for said P-wells being P-type with said N-well dopant being implanted with a concentration sufficient to make the resistivity of said N-well greater than that of said epitaxial layer, but insufficient to change the polarity of said N-well to P-type;

simultaneously implanting element regions for both said NPN and PNP devices and source regions and drain regions for said N-channel MOS devices;

simultaneously implanting element regions for both said NPN and PNP devices and source regions and drain regions for said P-channel MOS devices;

simultaneously diffusing said element regions for both said NPN and PNP devices, and said source and said drain regions; and thereafter forming contacts and completing said integrated circuit.

21. A method of making an integrated circuit in an epitaxial layer on a silicon substrate containing both N and P channel MOS devices and bipolar NPN and PNP devices comprising the steps of:

implanting a continuous buried layer region having a buried layer dopant concentration below the sites of said NPN, PNP, N-channel and P-channel devices, said buried layer region to be disposed below said epitaxial layer, and then implanting dopants in said epitaxial layer for at least one well for an MOS device;

forming field threshold adjustment regions in the upper portion of said epitaxial layer having a dopant concentration of about the same magnitude and of the same polarity as said buried layer dopant concentration;

simultaneously implanting element regions for both said NPN and PNP devices and source regions and drain regions for said N-channel MOS devices;

simultaneously implanting element regions for both said NPN and PNP devices and source regions and drain regions for said P-channel MOS devices;

next, cutting a trench about said PNP, NPN, N-channel and P-channel devices from said field threshold adjustment regions down to said buried layer, whereby said devices are isolated from one another by said trenches;

simultaneously diffusing said element regions for both said NPN and PNP devices, and said source and said drain regions; and thereafter forming contacts and completing said integrated circuit.

* * * * *